United States Patent
Youn et al.

(10) Patent No.: US 8,759,834 B2
(45) Date of Patent: *Jun. 24, 2014

(54) DISPLAY PANEL

(71) Applicant: Samsung Display Co., Ltd., Yongin (KR)

(72) Inventors: Joo-Ae Youn, Seongnam-si (KR); Yang-Ho Bae, Seoul (KR); Chang-Oh Jeong, Suwon-si (KR); Chong-Chul Chai, Seoul (KR); Pil-Sang Yun, Seoul (KR); Hong Long Ning, Suwon-si (KR); Byeong-Beom Kim, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/947,459

(22) Filed: Jul. 22, 2013

(65) Prior Publication Data

US 2013/0306973 A1 Nov. 21, 2013

Related U.S. Application Data

(62) Division of application No. 13/472,716, filed on May 16, 2012, now Pat. No. 8,492,190, which is a division of application No. 12/354,115, filed on Jan. 15, 2009, now Pat. No. 8,199,297.

(30) Foreign Application Priority Data

Feb. 21, 2008 (KR) .................. 10-2008-0015881

(51) Int. Cl.
*H01L 21/33* (2006.01)

(52) U.S. Cl.
USPC .................. 257/59; 257/40; 257/66; 257/72; 257/E29.273; 349/43; 349/139

(58) Field of Classification Search
USPC ........... 257/25, 40, 49, 53, 59, 66–67, 72, 79, 257/700; 438/34, 72, 149, 151, 158, 166, 438/30, 160, 765
See application file for complete search history.

(56) References Cited

U.S. PATENT DOCUMENTS

| | | | |
|---|---|---|---|
| 6,946,680 B2 | 9/2005 | Jang | |
| 7,227,181 B2 | 6/2007 | Hwang | |
| 7,417,693 B2 | 8/2008 | Kawasaki | |
| 7,436,461 B2 | 10/2008 | Choi et al. | |
| 7,737,448 B2 | 6/2010 | Cho et al. | |
| 7,977,140 B2 | 7/2011 | Takeda et al. | |
| 8,199,297 B2 * | 6/2012 | Youn et al. | 349/139 |
| 2005/0253249 A1 | 11/2005 | Chen et al. | |
| 2006/0202199 A1 | 9/2006 | Kim et al. | |
| 2008/0164470 A1 | 7/2008 | Wang et al. | |

* cited by examiner

*Primary Examiner* — Dung A. Le

(74) *Attorney, Agent, or Firm* — Cantor Colburn LLP

(57) ABSTRACT

A display panel includes; a lower gate line, a lower data line disposed substantially perpendicular to the lower gate line, a thin film transistor ("TFT") connected to the lower gate line and the lower data line, an insulating layer disposed on the lower gate line, the lower data line, and the TFT and having a plurality of trenches exposing the lower gate line and the lower data line, an upper gate line disposed in the trench on the lower gate line, an upper data line disposed in the trench on the lower data line, and a pixel electrode connected to the TFT.

10 Claims, 18 Drawing Sheets

FIG.3
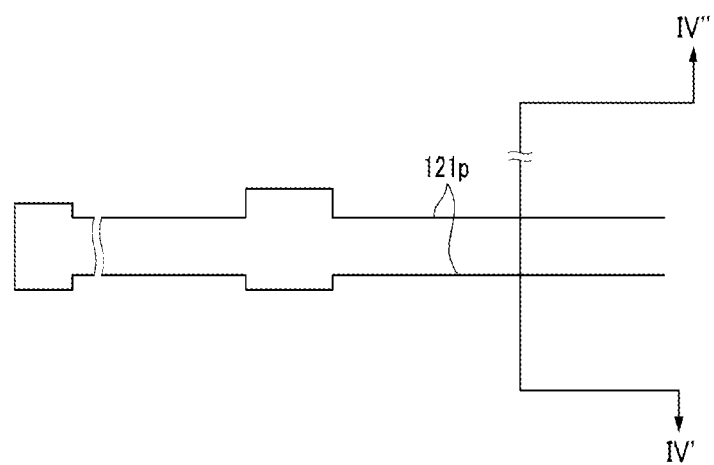
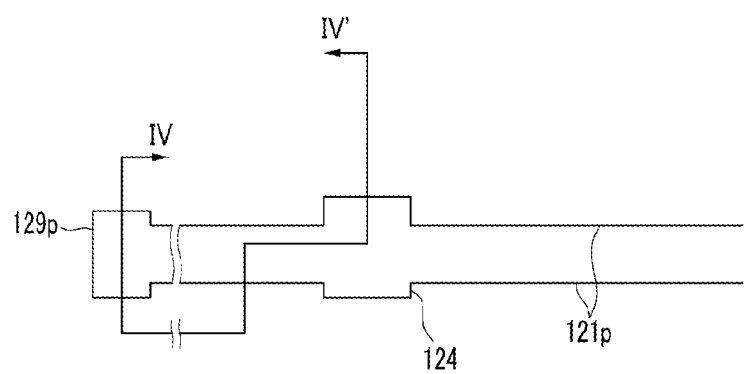

FIG.5
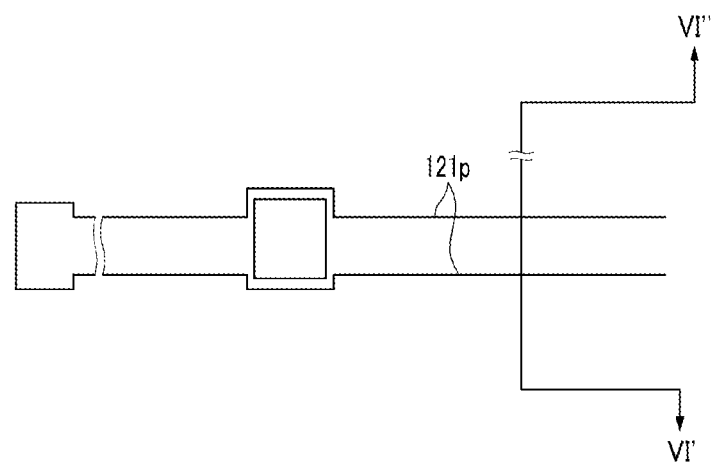
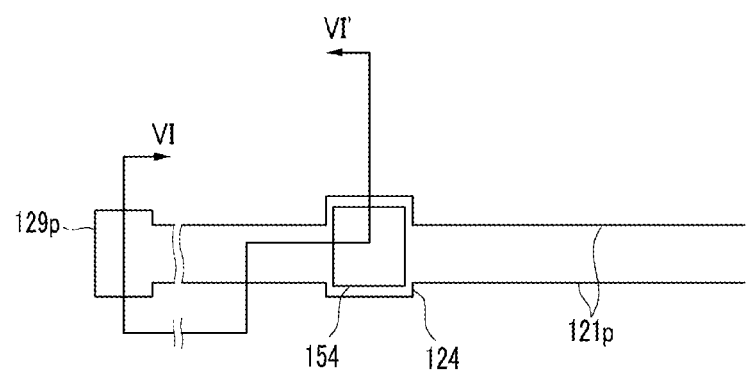

DISPLAY PANEL

This application is a continuation of U.S. patent application Ser. No. 13/472,716, filed on May 16, 2012, which claims priority to a divisional of U.S. patent application Ser. No. 12/354,115, filed on Jan. 15, 2009, which claims priority to Korean Patent Application No. 10-2008-0015881 filed on Feb. 21, 2008 and all the benefits accruing therefrom under 35 U.S.C. §119, the contents of which in its entirety are herein incorporated by reference.

BACKGROUND OF THE INVENTION (a) Field of the Invention

The present invention relates to a display panel and a manufacturing method thereof.

(b) Description of the Related Art

A liquid crystal display ("LCD"), a plasma display panel ("PDP") and an organic light emitting device ("OLED") are among widely used flat panel displays.

These display devices include at least one display panel, and the display panel includes switching elements connected to field generating electrodes and a plurality of signal lines such as gate lines and data lines to apply the voltages to the field generating electrodes by controlling the switching elements. To reduce an afterimage of the display device and to improve the resolution, the resistance of the signal lines may be relatively low.

Particularly, according to an increase of the size of the display devices, a more improved response speed is required to obtain high quality, and research to reduce the resistance of the signal lines has actively progressed.

For a signal line with low resistance, a method in which a low resistance metal such as aluminum (Al), copper (Cu), and silver (Ag) is deposited and patterned by photolithography has been proposed, but the low resistance metal has a poor adhesion characteristic with a glass substrate and may be diffused into a lower layer or an upper layer such that the reliability when the low resistance metal is adapted to the actual process is decreased. Additional processes are required to compensate for this problem.

Also, to reduce the resistance of the signal lines, the metal may be thickly deposited. However, the substrate may be bent during the deposition process and the photolithography process such that it is difficult for the thickening of the signal lines to be reliably executed. Also, in LCDs, the liquid crystal alignment may be influenced by a stepped structure of the metal layers in the liquid crystal display such that light leakage may be generated.

BRIEF SUMMARY OF THE INVENTION

The present invention provides a reliably configured display while preventing a signal delay by ensuring low resistance and reliability of signal lines.

An exemplary embodiment of a display panel according to the present invention includes; a lower gate line, a lower data line disposed substantially perpendicular to the lower gate line, a thin film transistor ("TFT") connected to the lower gate line and the lower data line, an insulating layer disposed on the lower gate line, the lower data line, and the TFT and having a plurality of trenches exposing the lower gate line and the lower data line, an upper gate line disposed in the trench on the lower gate line, an upper data line disposed in the trench on the lower data line, and a pixel electrode connected to the TFT.

In one exemplary embodiment, the upper gate line may be thicker than the lower gate line, and the upper data line may be thicker than the lower data line.

In one exemplary embodiment, the upper gate line and upper data line may include one of copper (Cu) and silver (Ag).

In one exemplary embodiment, the lower gate line and the lower data line may include at least one selected from the group consisting of molybdenum (Mo), nickel (Ni) and titanium (Ti).

In one exemplary embodiment, the trenches have a linear shape and are aligned with at least one of the lower gate line and the lower data line.

In one exemplary embodiment, the trenches may not be disposed on the TFT.

In one exemplary embodiment, the pixel electrode may be disposed under the insulating layer.

In one exemplary embodiment, the display panel may further include; a passivation layer disposed on the insulating layer, wherein the passivation layer and the insulating layer may have a contact hole exposing a portion of the TFT, and the pixel electrode may be connected to the TFT through the contact hole in the passivation layer.

In another exemplary embodiment, a display panel according to the present invention includes; a lower gate line including a gate electrode, a gate insulating layer disposed on the lower gate line, a semiconductor disposed on the gate insulating layer, a lower data line including a source electrode disposed overlapping a portion of the semiconductor, a drain electrode disposed substantially opposite to the source electrode and overlapping a portion of the semiconductor, an insulating layer disposed on the lower data line and the drain electrode and including a plurality of trenches exposing the lower gate line and the data line, an upper gate line disposed in the trench on the lower gate line, an upper data line disposed in the trench on the lower data line, and a pixel electrode connected to the drain electrode.

In one exemplary embodiment, the trenches may have a linear shape, and the trenches may not be disposed on the gate electrode, the source electrode, and the drain electrode.

An exemplary embodiment of a manufacturing method of a display panel according to the present invention includes; forming a lower gate line, disposing a semiconductor on the lower gate line, disposing a lower data line substantially perpendicular to the lower gate line, disposing an insulating layer having a plurality of trenches exposing the lower gate line and the lower data line on the lower data line, disposing an upper gate line on the lower gate line and within the plurality of trenches, and disposing an upper data line on the lower data line and within the plurality of trenches.

In one exemplary embodiment, the upper gate line and upper data line may include one of copper (Cu) and silver (Ag).

In one exemplary embodiment, an electroless plating method may be used to dispose the upper gate line and upper data line on the lower gate line and lower data line, respectively.

In one exemplary embodiment, a lift-off method may be used to dispose the upper gate line and upper data line on the lower gate line and the lower data line, respectively.

An exemplary embodiment of a manufacturing method of a display panel according to the present invention includes; forming a lower gate line including a gate electrode, disposing a gate insulating layer on the lower gate line, disposing a semiconductor overlapping the gate electrode on the gate insulating layer, disposing a lower data line on the gate insulating layer, the lower data line including a source electrode overlapping a portion of the semiconductor, disposing a drain electrode overlapping the portion of the semiconductor and substantially opposite to the source electrode, disposing an insulating layer on the lower data line and the drain electrode, removing a portion of the insulating layer and the gate insulating layer to form a plurality of trenches exposing the lower gate line and the lower data line, disposing an upper gate line on the lower gate line within the plurality of trenches, and disposing an upper data line on the lower data line within the plurality of trenches, and connecting a pixel electrode to the drain electrode.

In one exemplary embodiment, the upper gate line and upper data line may include one of copper (Cu) or silver (Ag).

In one exemplary embodiment, an electroless plating method may be used to dispose the upper gate line and upper data line on the lower gate line and the lower data line, respectively.

In one exemplary embodiment, a lift-off method may be used to dispose the upper gate line and upper data line on the lower gate line and lower data line, respectively.

In one exemplary embodiment, the pixel electrode may be connected to the drain electrode before the disposition of the lower data line and the drain electrode.

In one exemplary embodiment, the method may further include; disposing a passivation layer on the upper gate line, the upper data line, and the insulating layer, and forming a contact hole exposing the drain electrode in the passivation layer and the insulating layer after forming the upper gate line and the upper data line, wherein the pixel electrode may be connected to the drain electrode through the contact hole.

According to an exemplary embodiment of the present invention, the gate line and the data line are formed with a double-layered structure such that adhesion with the substrate or the lower layer may be improved and lifting and peeling of the signal lines as well as signal delay may be simultaneously prevented.

Also, the gate line and data line are thickly formed such that the resistance of the signal lines may be reduced, and the upper gate line and the upper data line are not overlapped such that the entire thickness of the signal lines is decreased, and as a result an increase of the load of the substrate is prevented to thereby prevent the substrate from bending.

Also, the upper gate line and the upper data line are not overlapped to each other such that the step coverage is not large at an intersection of the gate line and the data line, thereby preventing deteriorations such as a disconnection and a short of the signal lines generated due to the step coverage.

Also, the upper gate line and the upper data line made of the low resistance metal may be simultaneously formed by executing an electroless plating method using the lower gate line and the lower data line as a seed metal layer such that the number of manufacturing process steps may be reduced compared with the respective formation of the upper gate line and the upper data line.

BRIEF DESCRIPTION OF THE DRAWINGS

FIG. 3, FIG. 5, FIG. 7, FIG. 9, and FIG. 11 are top plan layout views sequentially showing exemplary embodiments of processes for manufacturing the exemplary embodiment of a display panel shown in FIG. 1 and FIG. 2 according to the present invention.

DETAILED DESCRIPTION OF THE INVENTION

Figure 1:
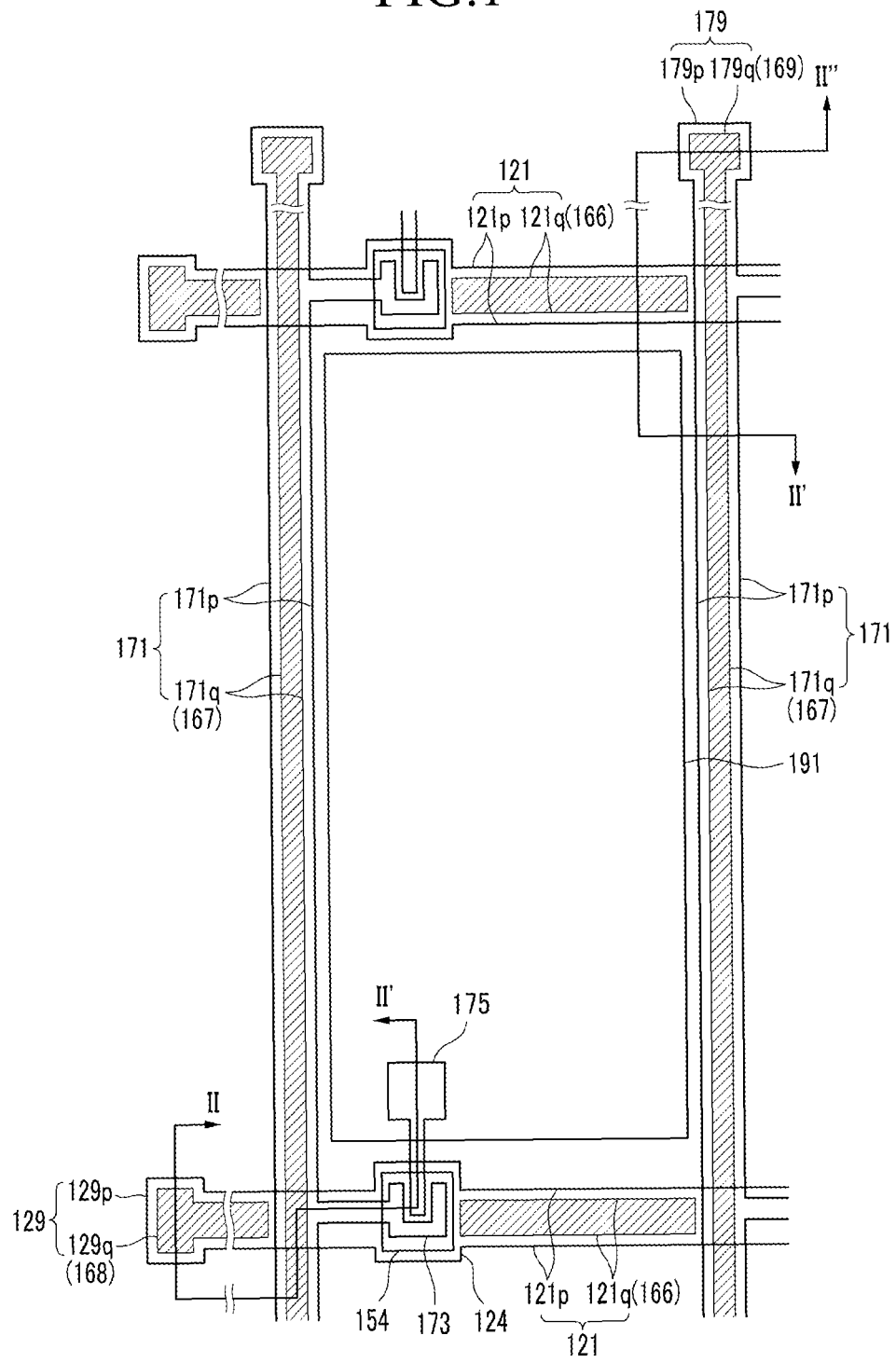
FIG. 1 is a top plan layout view of an exemplary embodiment of a thin film transistor array panel according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Exemplary Embodiment 1

Firstly, an exemplary embodiment of a thin film transistor array panel according to the present invention will be described with reference to FIG. 1 and FIG. 2.

Figure 2:
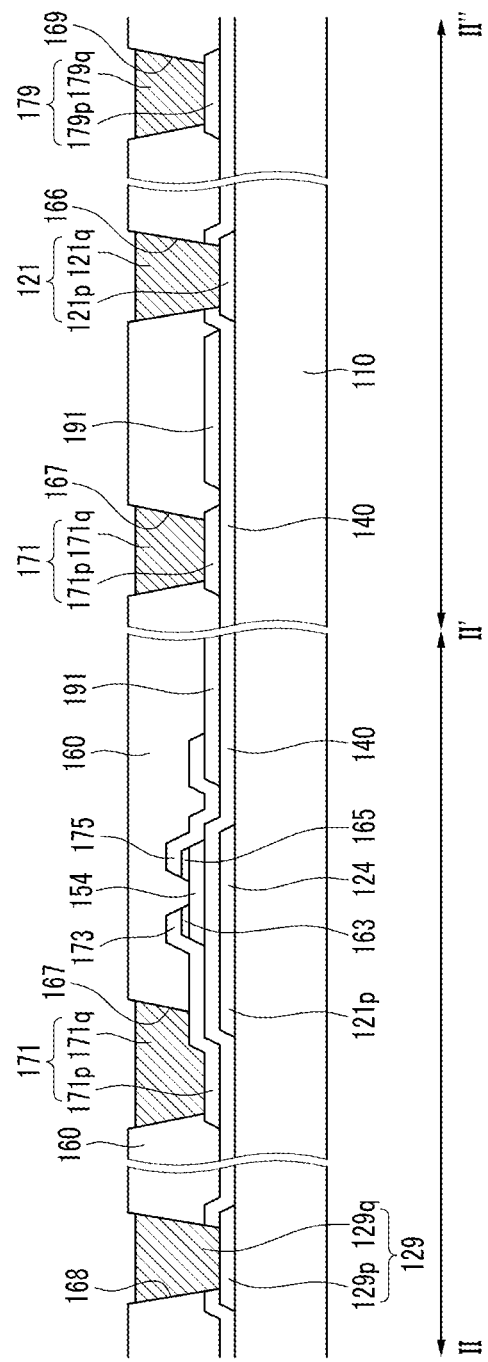
FIG. 2 is a cross-sectional view of the exemplary embodiment of a thin film transistor array panel shown in FIG. 1 taken along line II-II'-II".

FIG. 1 is a top plan layout view of an exemplary embodiment of a thin film transistor array panel according to the present invention, and FIG. 2 is a cross-sectional view of the exemplary embodiment of a thin film transistor array panel shown in FIG. 1 taken along line II-II'-II".

A plurality of lower gate lines 121p are formed on an insulating substrate 110, exemplary embodiments of which may be made of transparent glass, plastic or other materials with similar characteristics. The lower gate lines 121p extend in a substantially horizontal direction, and each lower gate line 121p includes a plurality of gate electrodes 124 projecting outward from the lower gate line 121p with a wide width, and an end portion 129p having a large area for contact with an external driving circuit. Alternative exemplary embodiments include configurations wherein the end portion 129p is omitted.

Exemplary embodiments of the lower gate line 121p may be made of molybdenum (Mo), nickel (Ni), titanium (Ti), or an alloy thereof, and may have a thickness of about 2000 Å to 10,000 Å.

A gate insulating layer 140, exemplary embodiments of which may be made of silicon oxide ("$SiO_2$") or silicon nitride ("$SiN_x$") may be formed on the lower gate lines 121p and the insulation substrate 110.

A plurality of semiconductor islands 154 are formed overlapping the gate electrodes 124 on the gate insulating layer 140, and ohmic contacts 163 and 165 are formed on the semiconductor islands 154. In one exemplary embodiment, the ohmic contacts 163 and 165 are disposed as a pair on the semiconductor islands 154. Exemplary embodiments of the semiconductor islands 154 may include a silicon compound such as hydrogenated amorphous silicon ("a-Si") or polysilicon ("poly-Si"), or an oxide semiconductor such as zinc oxide ("ZnOx") or other materials with similar characteristics, and exemplary embodiments of the ohmic contacts 163 and 165 may be made of n+ hydrogenated a-Si heavily doped with an N-type impurity such as phosphorous, or of silicide.

A plurality of pixel electrodes 191 is formed on the gate insulating layer 140. In the exemplary embodiment shown in FIGS. 1 and 2, the pixel electrodes 191 are separated from the lower gate lines 121p and the semiconductor islands 154; however, alternative exemplary embodiments include configurations wherein they may overlap the lower gate lines 121p if necessary. In one exemplary embodiment, the pixel electrodes 191 may be made of a transparent conductor, exemplary embodiments of which include indium tin oxide ("ITO") or indium zinc oxide ("IZO"), or of an opaque conductor, exemplary embodiments of which include aluminum (Al) or silver (Ag), and may have a thickness of about 400 Å to about 3000 Å.

A plurality of lower data lines 171p and a plurality of drain electrodes 175 are formed on the ohmic contacts 163 and 165, the pixel electrodes 191, and the gate insulating layer 140. The lower data lines 171p extend in a substantially vertical direction, thereby forming a matrix shape with the lower gate lines 121p. In one exemplary embodiment, the lower data lines 171p and lower gate lines 121p are disposed substantially perpendicular to each other. Each lower data line 171p includes a plurality of source electrodes 173 extending toward the gate electrodes 124 and an end portion 179 having a wide area for connection with an external driving circuit. Alternative exemplary embodiments include configurations wherein the end portion 179 is omitted.

The drain electrodes 175 are separated from the lower data lines 171p, and therefore also the source electrodes 173, and in the current exemplary embodiment, each includes one end portion with a bar shape and another end portion having a large area. A portion of the bar end portions of the drain electrodes 175 may be enclosed by the source electrode 173, and the wide end portions of the drain electrodes 175 may be disposed on the pixel electrodes 191 and contacted with the pixel electrodes 191. The pixel electrodes 191 receive data voltages from the drain electrodes 175. The source electrodes 173 and the drain electrodes 175 are disposed opposite to each other on the semiconductor islands 154.

In the present exemplary embodiment, a gate electrode 124, a source electrode 173, and a drain electrode 175, along with a semiconductor island 154, form a thin film transistor ("TFT"), and the channel of the thin film transistor is formed in the semiconductor island 154 between the source electrode 173 and the drain electrode 175.

An insulating layer 160 is formed on the lower data lines 171p, the drain electrodes 175, the gate insulating layer 140, and the pixel electrodes 191.

In one exemplary embodiment, the insulating layer 160 may be made of an inorganic insulating material, exemplary embodiments of which include silicon oxide or silicon nitride, or an organic insulating material, and the thickness of the insulating layer 160 may be in a range of about 5000 Å to about 30,000 Å. In one exemplary embodiment, the insulating layer 160 functions as a planarization layer and includes a substantially flat top surface.

A plurality of trenches 166 and 167 are formed in the insulating layer 160, and the trenches 166 are also formed through the gate insulating layer 140. The plurality of trenches 166 and 167 include first trenches 167 extending in the vertical direction and second trenches 166 extending in the horizontal direction.

The first trenches 167 extend in the vertical direction and are substantially aligned with the lower data lines 171p and expose the lower data lines 171p. In the present exemplary embodiment, the width of the first trenches 167 is narrower than the width of the lower data lines 171p, and end portions 179p of the lower data lines 171p include wide end portions 169.

The second trenches 166 extend in the horizontal direction and are substantially aligned with the lower gate lines 121p and expose the lower gate lines 121p. In the present exemplary embodiment, the width of the second trenches 166 is narrower than the width of the lower gate lines 121p, and the second trenches 166 include a wide end portion 168 exposing the end portions 129p of the lower gate lines 121p.

In the present exemplary embodiment, the second trenches 166 are not disposed on a portion where they would intersect the first trenches 167 and at portions where the thin film transistors are disposed among the lower gate lines 121p.

A plurality of upper data lines 171q is formed on the first trenches 167. The upper data lines 171q are filled in the first trenches 167 and include wide end portions 169 disposed on the end portions 179p of the lower data lines 171p.

A plurality of upper gate lines 121q is formed in the second trenches 166. The upper gate lines 121q are filled in the second trenches 166 and include wide end portions 168 disposed on the end portions 129p of the lower gate lines 121p.

In one exemplary embodiment, the upper data lines 171q and the upper gate lines 121q may be made of a metal having low resistance, exemplary embodiments of which include copper (Cu), silver (Ag), alloys thereof, or other materials with similar characteristics. In the present exemplary embodiment, the upper data lines 171q and the upper gate lines 121q respectively have narrower width than the lower data lines 171p and the lower gate lines 121q, but they have greater thicknesses than the lower data lines 171p and the lower gate lines 121q. In one exemplary embodiment the upper data lines 171q and the upper gate lines 121q have a thickness in a range of about 5000 Å to about 30,000 Å.

In the present exemplary embodiment, the TFTs including the gate electrodes 124, the source electrodes 173, and the drain electrodes 175 are covered by the insulating layer 160 and the upper layers such as the upper gate lines 121q or the upper data lines 171q are not formed above the TFTs.

The lower gate lines 121p and the upper gate lines 121q transmit gate signals, and the lower data lines 171p and the upper data lines 171q transmit data signals.

In the present exemplary embodiment, the lower gate lines 121p and the lower data lines 171p are made of molybdenum, nickel, titanium, alloys thereof, or other materials with similar characteristics, such that they have good adhesion with the substrate 110 or the lower layers, thereby preventing lifting and peeling of the signal lines from the substrate 110. In the present exemplary embodiment, the upper gate lines 121q and the upper data lines 171q are made of a low resistance metal exemplary embodiments of which include copper, silver, alloys thereof, or other materials with similar characteristics such that a signal delay may be prevented in a display panel with a large size.

Also, although the gate lines 121 and the data lines 171 are thick, the upper gate lines 121q and the upper data lines 171q are disposed on substantially the same layer such that the entire thickness of the signal lines is reduced and therefore an increase of the load against the substrate may be prevented, thereby preventing bending of the substrate.

Also, the upper gate lines and the upper data lines are formed such that they do not overlap at sections where they would otherwise cross each other. The lack of overlap thereby prevents the generation of deteriorations such as the disconnections or shorts of the signal lines due to the lack of a large step coverage at intersections of the gate lines and data lines.

Next, an exemplary embodiment of a method of manufacturing the exemplary embodiment of a TFT array panel according to the present invention shown in FIG. 1 and FIG. 2 will be described with reference to FIG. 3 to FIG. 12.

Figure 4:
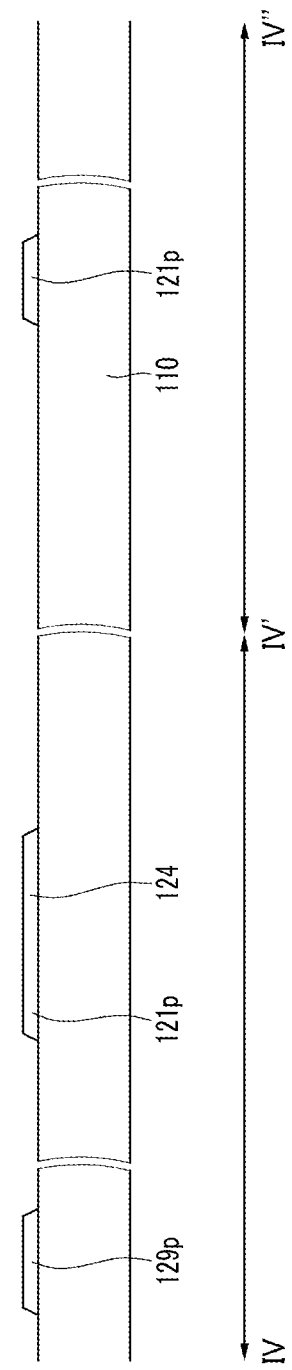
FIG. 4 is a cross-sectional view of the exemplary embodiment of a display panel shown in FIG. 3 taken along line IV-IV'-IV".
Figure 6:
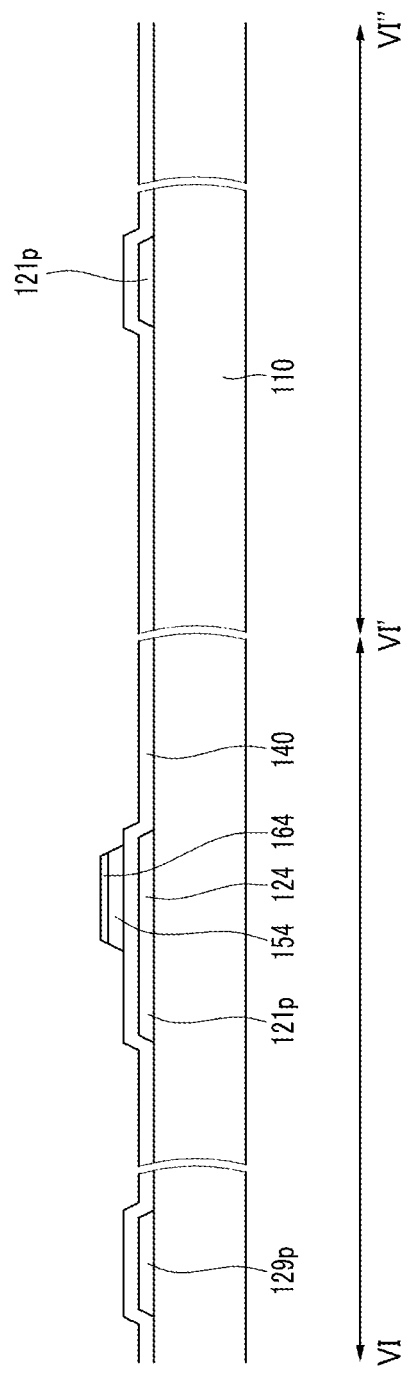
FIG. 6 is a cross-sectional view of the exemplary embodiment of a display panel shown in FIG. 5 taken along line VI-VI'-VI".
Figure 7:
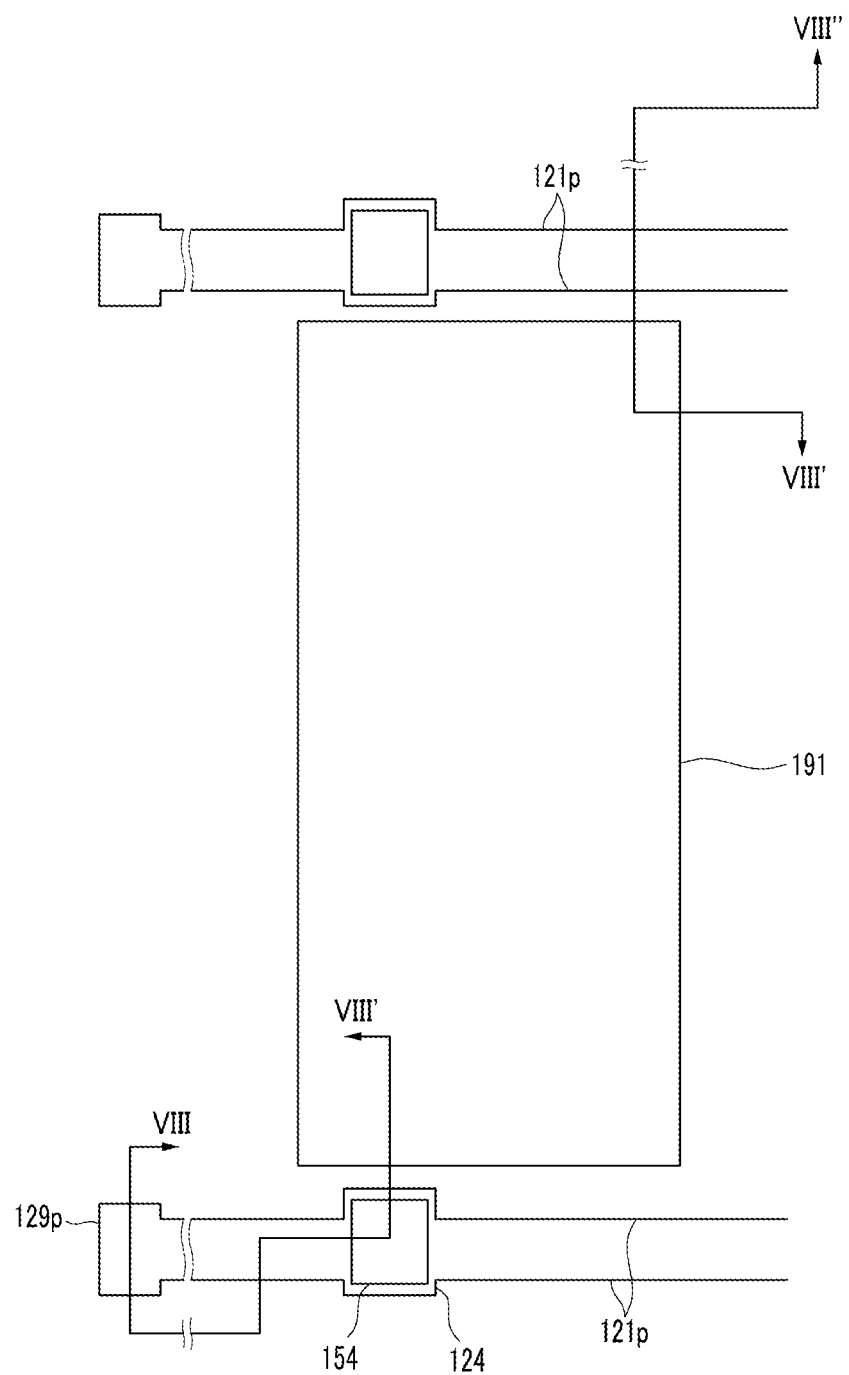
Figure 8:
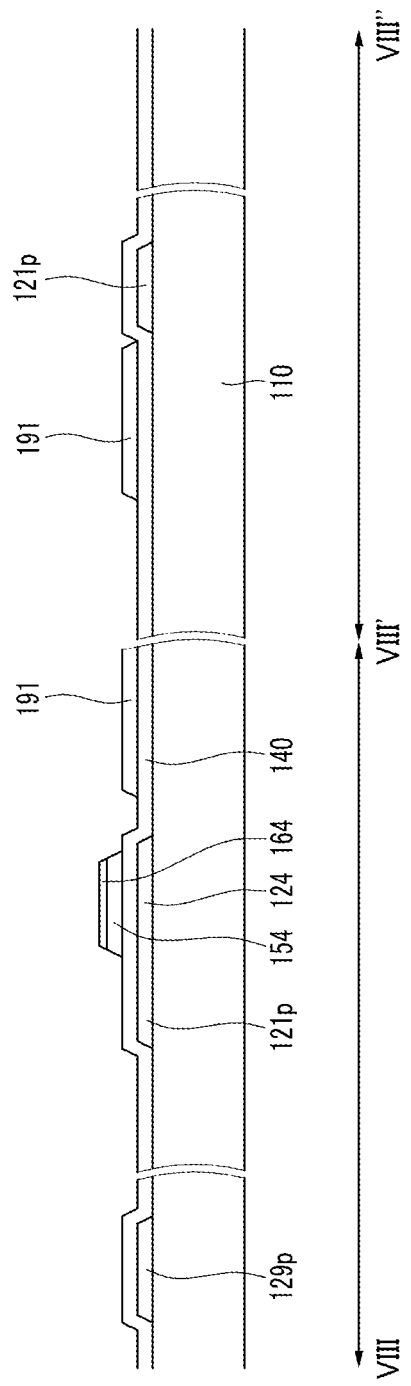
FIG. 8 is a cross-sectional view of the exemplary embodiment of a display panel shown in FIG. 7 taken along line VIII-VIII'-VIII".
Figure 9:
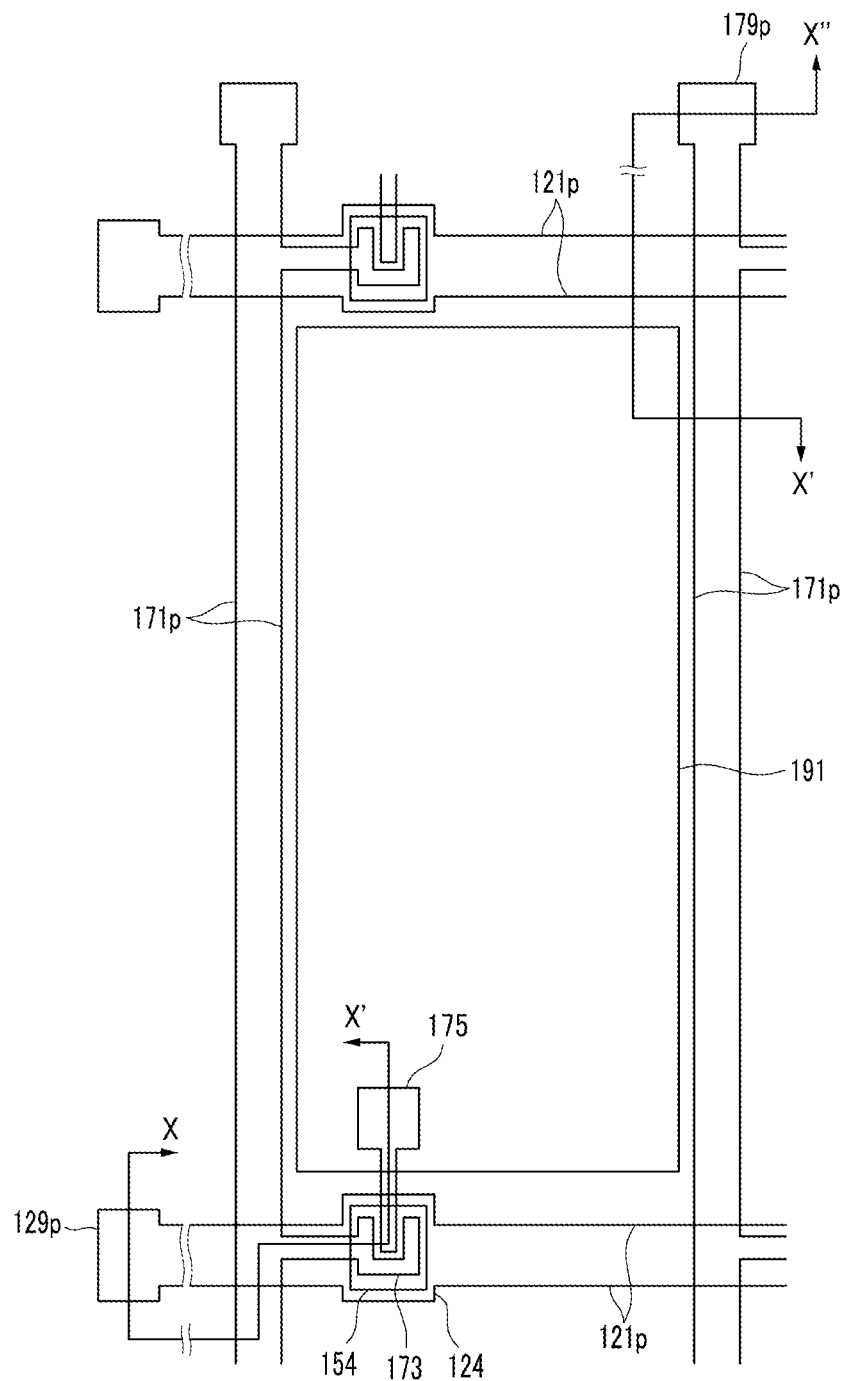
Figure 10:
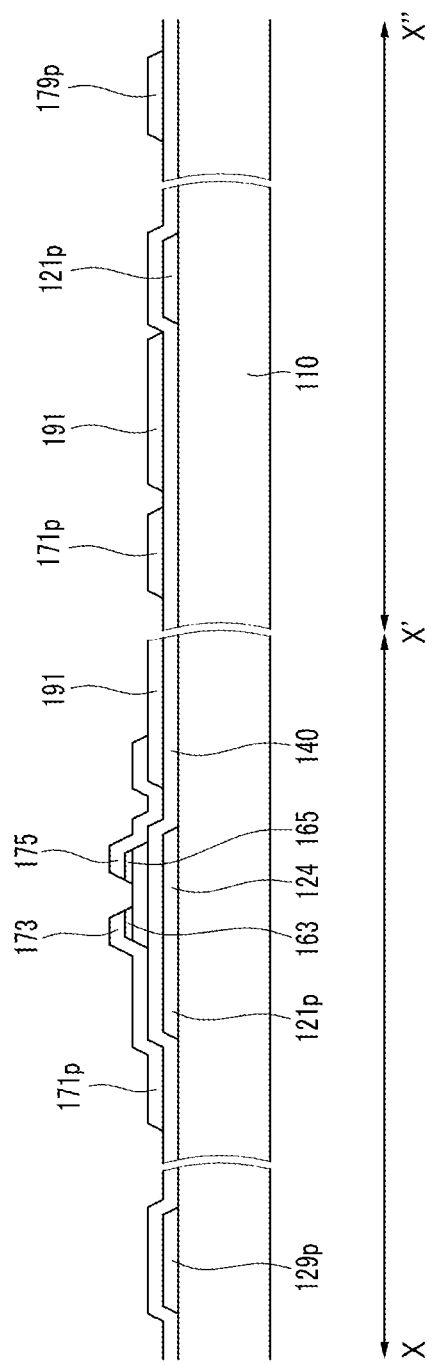
FIG. 10 is a cross-sectional view of the exemplary embodiment of a display panel shown in FIG. 9 taken along line X-X-X".
Figure 11:
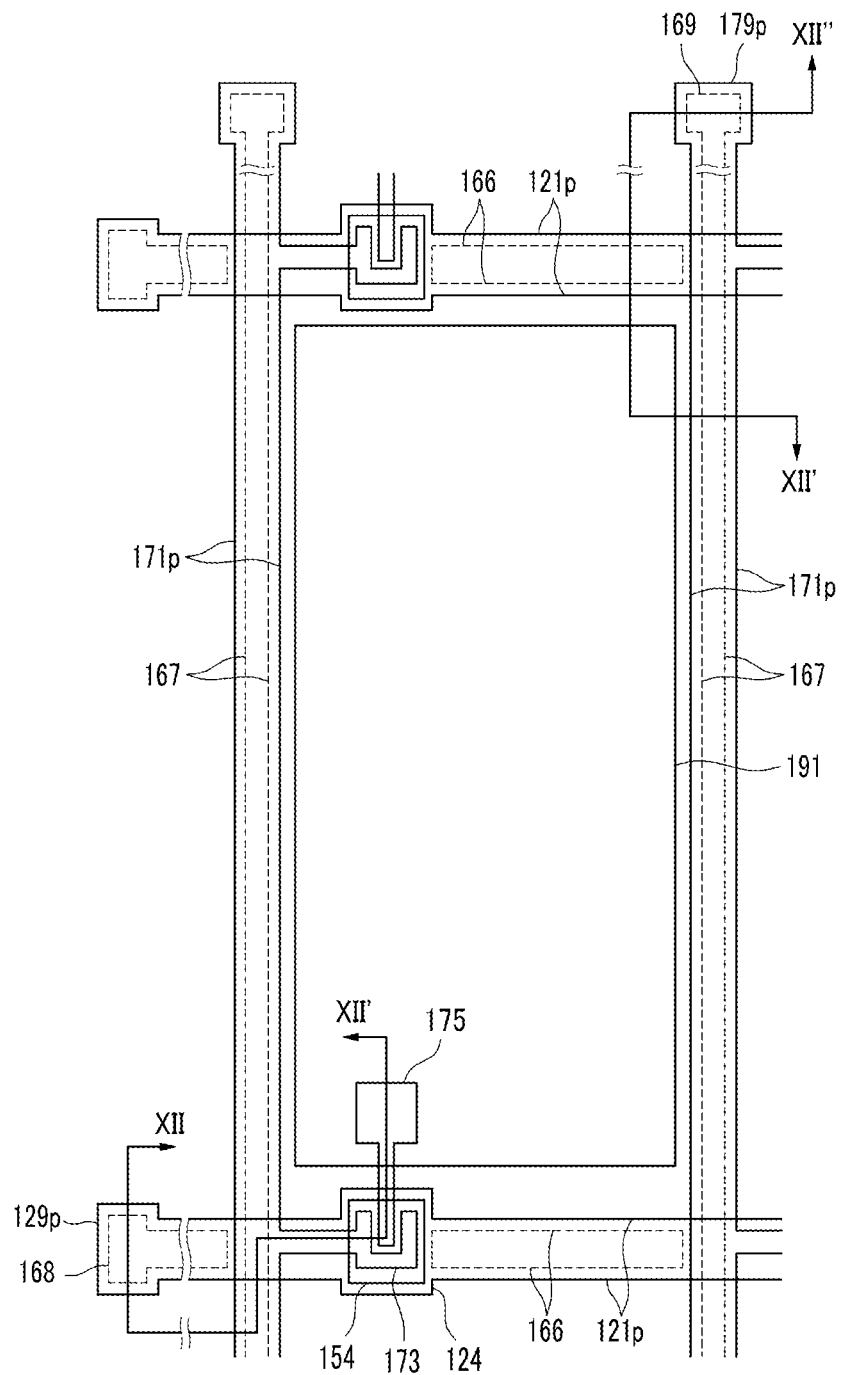
Figure 12:
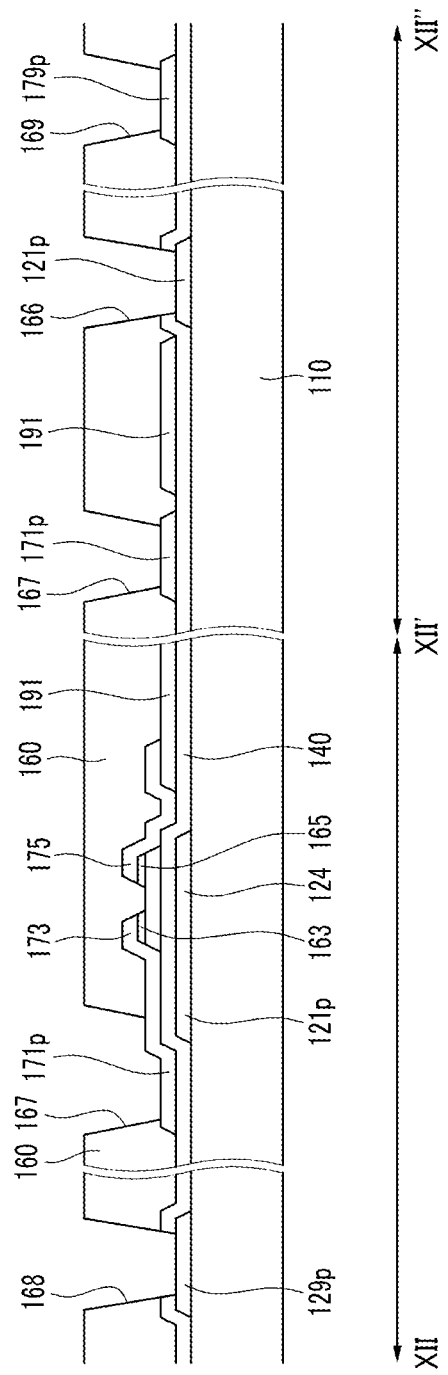
FIG. 12 is a cross-sectional view of the exemplary embodiment of a display panel shown in FIG. 11 taken along line XII-XII'-XII".

FIG. 3, FIG. 5, FIG. 7, FIG. 9, and FIG. 11 are top plan layout views sequentially showing exemplary embodiments of processes for manufacturing the exemplary embodiment of a display panel shown in FIG. 1 and FIG. 2 according to the present invention, FIG. 4 is a cross-sectional view of the exemplary embodiment of a display panel shown in FIG. 3 taken along line IV-IV'-IV''', FIG. 6 is a cross-sectional view of the exemplary embodiment of a display panel shown in FIG. 5 taken along line VI-VI'-VI'', FIG. 8 is a cross-sectional view of the exemplary embodiment of a display panel shown in FIG. 7 taken along line VIII-VIII'-VIII'', FIG. 10 is a cross-sectional view of the exemplary embodiment of a display panel shown in FIG. 9 taken along line X-X'-X'', and FIG. 12 is a cross-sectional view of the exemplary embodiment of a display panel shown in FIG. 11 taken along line XII-XII'-XII''.

Referring to FIG. 3 and FIG. 4, a seed metal layer, exemplary embodiments of which may be made of molybdenum (Mo), nickel (Ni), titanium (Ti), an alloy thereof or other materials with similar characteristics, is deposited on an insulation substrate 110 and patterned by photolithography to form a plurality of lower gate lines 121p including gate electrodes 124 and end portions 129p.

Next, referring to FIG. 5 and FIG. 6, a gate insulating layer 140, a semiconductor layer, and an impurity semiconductor layer are sequentially deposited on the lower gate lines 121p and the substrate 110, and the semiconductor layer and the impurity semiconductor layer are patterned by photolithography to form a plurality of semiconductor islands 154 and ohmic contact layers 164 overlapping the gate electrodes 124.

Next, referring to FIG. 7 and FIG. 8, a transparent conductive layer or opaque conductive layer is deposited on the gate insulating layer 140 and the ohmic contact layer 164. The transparent or opaque conductive layer are then patterned by photolithography to form a plurality of pixel electrodes 191 disposed between lower gate lines 121p.

Referring to FIG. 9 and FIG. 10, a seed metal layer, exemplary embodiments of which may be made of molybdenum (Mo), nickel (Ni), titanium (Ti), an alloy thereof, or other materials with similar characteristics, is deposited on the gate insulating layer 140, the ohmic contact layers 164, and the pixel electrodes 191 and patterned by photolithography to form a plurality of lower data lines 171p including source electrodes 173 and end portions 179p and a plurality of drain electrodes 175.

Next, in one exemplary embodiment, the ohmic contact layers 164 are etched by a back channel etch ("BCE") process using the source electrodes 173 and the drain electrodes 175 as an etching mask to form a pair of a plurality of ohmic contacts 163 and 165 and expose the semiconductor islands 154 between the source electrodes 173 and the drain electrodes 175.

Referring to FIG. 11 and FIG. 12, an insulating layer 160 is deposited on the lower data lines 171p, the drain electrodes 175, the exposed semiconductor islands 154, and the gate insulating layer 140.

Next, the insulating layer 160 and the gate insulating layer 140 are patterned to form a plurality of trenches 166 and 167. The trenches include first trenches 167 which extend in the substantially vertical direction and are aligned with the lower data lines 171p and expose the lower data lines 171p, and second trenches 166 which extend in the substantially horizontal direction and are aligned with the lower gate lines 121p and expose the lower gate lines 121p. Also, the first trenches 167 include wide end portions 169 exposing the end portions 179p of the lower data lines 171p, and the second trenches 166 includes wide end portions 168 exposing the end portions 129p of the lower gate lines 121p.

Next, referring to FIG. 1 and FIG. 2, a plurality of upper data lines 171q and upper gate lines 121q are formed in the first trenches 167 and the second trenches 166. In one exemplary embodiment, the upper data lines 171q and 121q are formed substantially simultaneously in the first and second trenches 167 and 166, respectively.

In one exemplary embodiment, the upper data lines 171q and the upper gate lines 121q may be formed by executing an electroless plating method using an electrolyte solution with a low resistance metal such as copper or silver. In the electroless plating method, the substrate may be soaked in the electrolyte solution or the electrolyte solution may be sprayed on the substrate.

According to an exemplary embodiment of the present invention, the lower gate lines 121p and the lower data lines 171p may be used as a seed metal layer, and the upper gate lines 121q including end portions 129q and the upper data lines 171q including end portions 179q may be simultaneously formed thereon by executing the electroless plating method with the low resistance metal such as copper, silver, an alloy thereof or other materials having similar characteristics.

As mentioned above, according to an exemplary embodiment of the present invention, the upper gate lines and the upper data lines made of the low resistance metal may be simultaneously formed such that the number of manufacturing process steps may be reduced as compared with the respective formation.

Also, the electroless plating using the seed metal layer may be executed to thickly form the gate lines without the use of the conventional photolithography such that problems of adhesion deterioration with the substrate may be solved.

Exemplary Embodiment 2

Now, another exemplary embodiment of the present invention will be described in detail with reference to FIG. 13 and FIG. 1.

Figure 13:
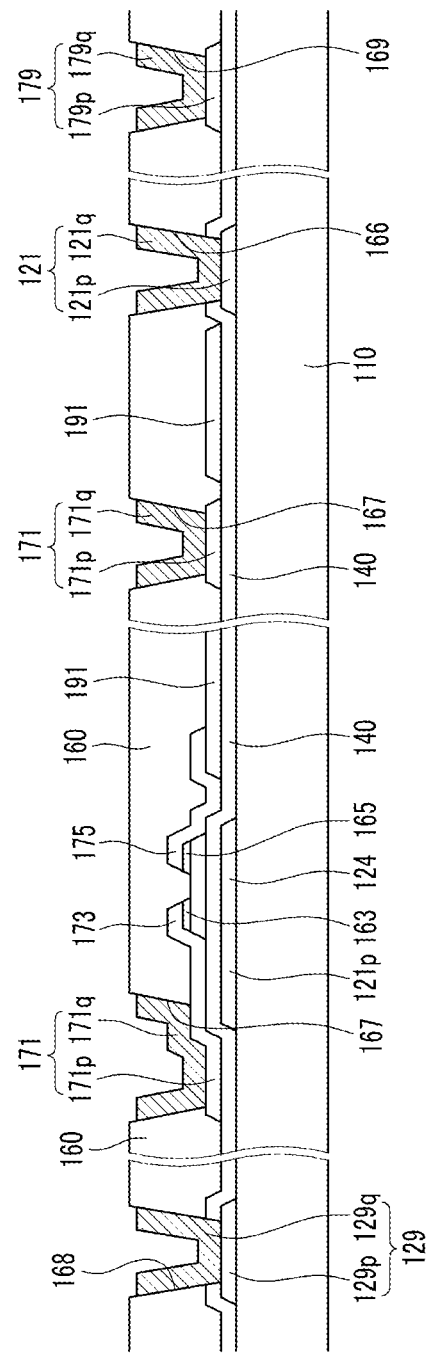
FIG. 13 is a cross-sectional view of another exemplary embodiment of a thin film transistor array panel according to the present invention.

FIG. 13 is a cross-sectional view of another exemplary embodiment of a TFT array panel according to the present invention. Like descriptions between the exemplary embodiments will be mainly omitted, and like reference numerals will be used for like elements.

The present exemplary embodiment is substantially the same as the above exemplary embodiment in many respects, and therefore only that which is different from the previous exemplary embodiment will be thoroughly described.

A lower gate line 121p including gate electrodes 124 and an end portion 129p is formed on an insulation substrate 110, and a gate insulating layer 140, a semiconductor island 154, and ohmic contacts 163 and 165 are formed thereon. A pixel electrode 191 is formed on the gate insulating layer 140, and a lower data line 171p including source electrodes 173 and an end portion 179p and a drain electrode 175 are respectively formed on the right and left sides of the pixel electrode 191. An insulating layer 160 including a plurality of trenches 166 and 167 are formed on the lower data line 171p, the drain electrode 175, and the pixel electrode 191. The trenches include first trenches 167 which extend in the substantially vertical direction and are aligned with the lower data line 171p and second trenches 166 which extend in the substantially horizontal direction and are aligned with the lower gate line 121p. In one exemplary embodiment, the first trenches 167 and the second trenches 166 respectively include wide end portions 169 and 168.

An upper data line 171q and an upper gate line 121q are respectively formed in the first trench 167 and the second trench 166. However, in the present exemplary embodiment, the upper data line 171q and the upper gate line 121q are formed by a deposition method such as sputtering, differently from the above exemplary embodiment.

Next, the method for manufacturing the thin film transistor array panel shown in FIG. 13 will be described in detail with reference to FIG. 14 to FIG. 16 as well as FIG. 3 to FIG. 10.

Figure 14:
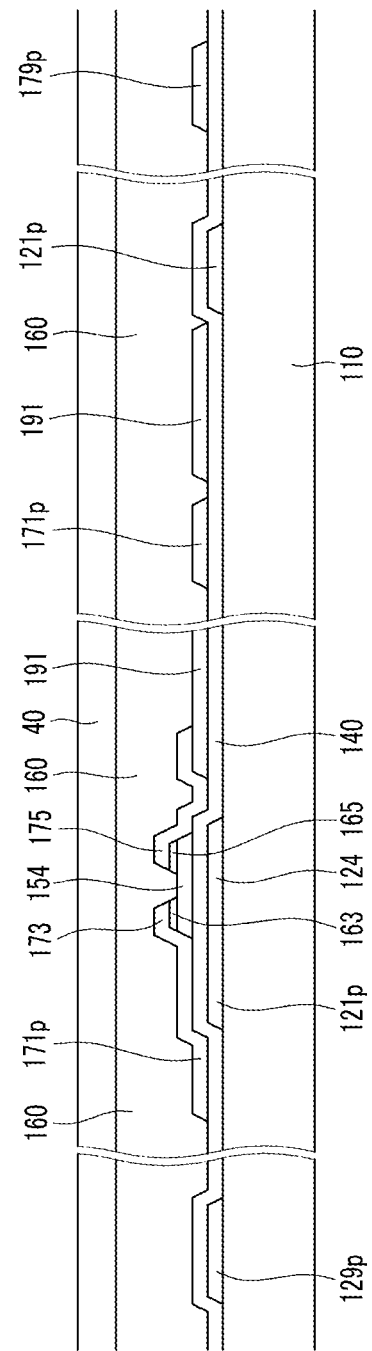
FIG. 14 to FIG. 16 are top plan layout views sequentially showing exemplary embodiments of processes for manufacturing the exemplary embodiment of a thin film transistor array panel according to the present invention.
Figure 15:
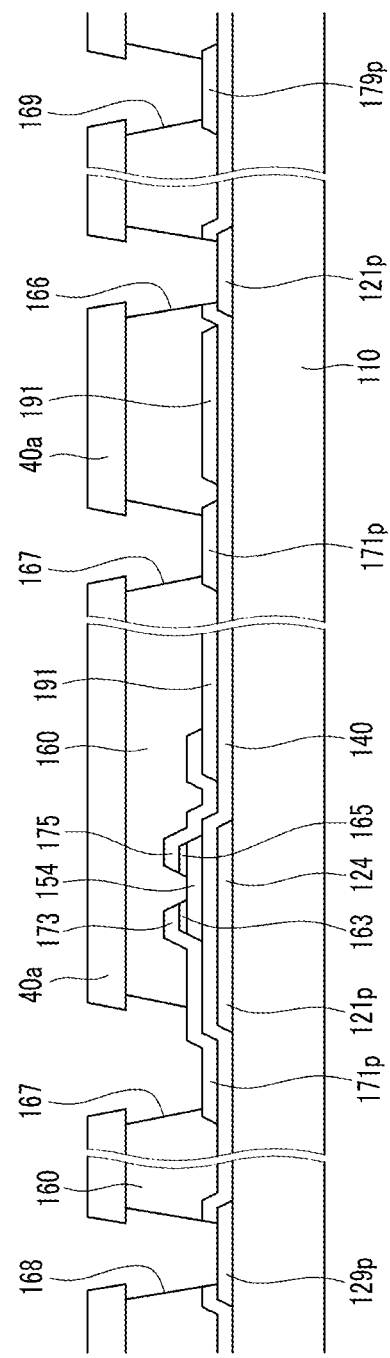
Figure 16:
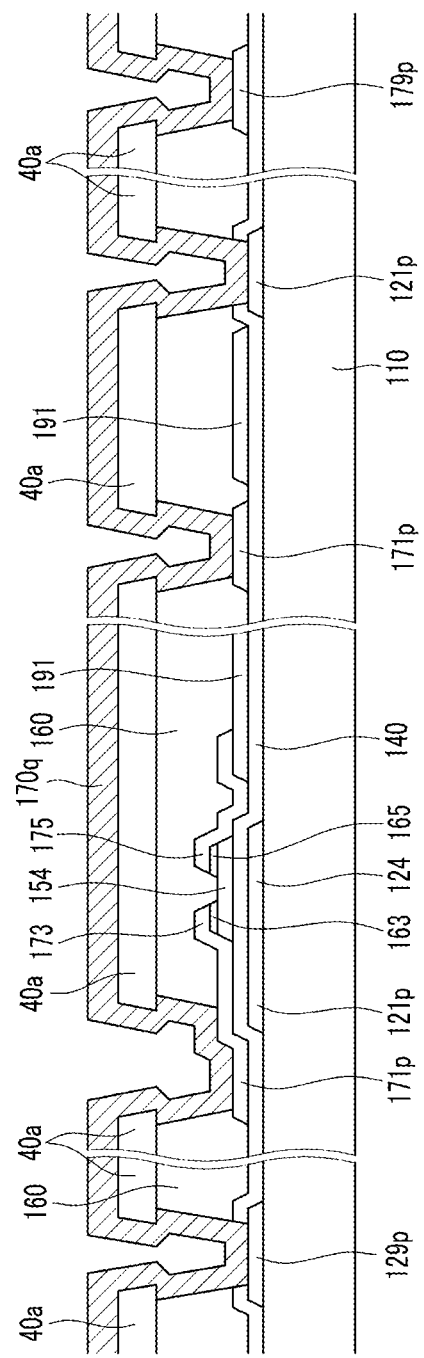

FIG. 14 to FIG. 16 are cross-sectional views of another exemplary embodiment of a TFT array panel according to the present invention sequentially showing processes for manufacturing the TFT array panel according to another exemplary embodiment of the present invention.

In the present exemplary embodiment, an upper gate line 121q and an upper data line 171q are formed by a lift-off method, rather than by electroless plating as described in the previous exemplary embodiment.

First, similar to the above exemplary embodiment, a lower gate line 121p including gate electrodes 124 and an end portion 129p, a gate insulating layer 140, a semiconductor island 154, ohmic contacts 163 and 165, a lower data line 171p including source electrodes 173 and an end portion 179p, and a drain electrode 175 are formed as described with respect to FIG. 3 to FIG. 10.

Next, referring to FIG. 14, an insulating layer 160 is deposited on the lower data line 171, the drain electrode 175, and the gate insulating layer 140, and a photosensitive film 40 is coated thereon.

Next, referring to FIG. 15, the photosensitive film 40 is exposed and developed to form a plurality of photoresist patterns 40a, and the insulating layer 160 is patterned by using the photoresist patterns 40a as a mask. As a result of the patterning, the first trench 167 having a wide end portion 169 and the second trench 166 having a wide end portion 168 are formed in the insulating layer 160, and the lower data line 171p having the end portion 179p and the lower gate line 121p having the end portion 129p disposed thereunder are respectively exposed through the first trench 167 and the second trench 166.

Next, referring to FIG. 16, a metal layer 170q having low resistance, exemplary embodiments of which include copper (Cu) or silver (Ag), is deposited on substantially the entire surface of the substrate. In one exemplary embodiment, the metal layer 170q may be formed by a sputtering method.

Next, the photoresist pattern 40a and the overlying metal layer 170q are removed through a lift-off process. In the lift-off process, the metal layer 170q disposed on the side surface and the upper surface of the photoresist pattern 40a is removed together. Therefore, as shown in FIG. 13, the upper data line 171q disposed on the lower data line 171p is formed in the first trench 167, and the upper gate line 121q disposed on the lower gate line 121p is formed in the second trench 166. Alternative exemplary embodiments include configurations wherein the photoresist pattern 40a and the overlying metal layer 170q are removed via other methods as are known in the art.

Exemplary Embodiment 3

Next, another exemplary embodiment according to the present invention will be described with reference to FIG. 17 and FIG. 18.

Figure 17:
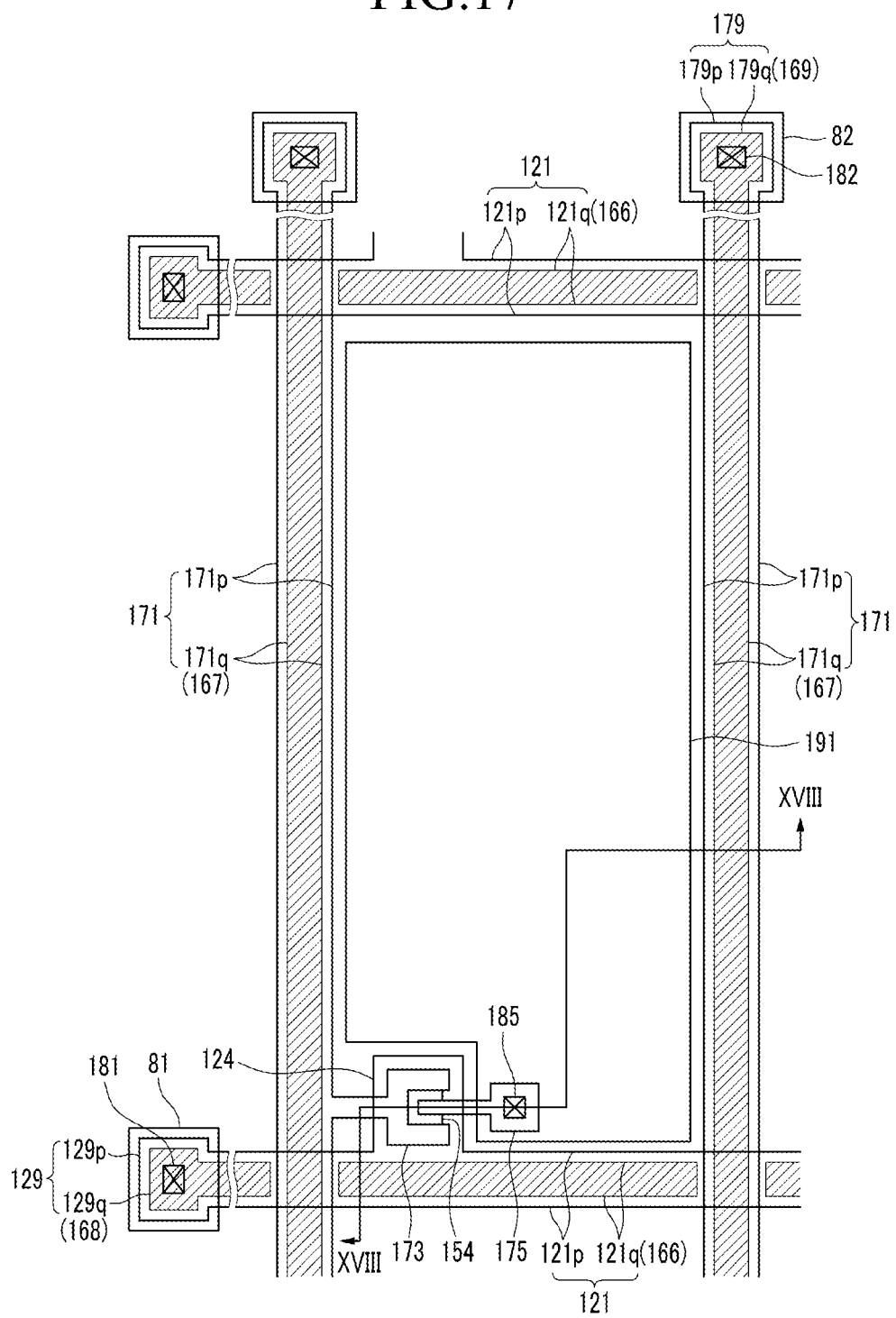
FIG. 17 is a top plan layout view of an exemplary embodiment of a thin film transistor array panel according to the present invention.
Figure 18:
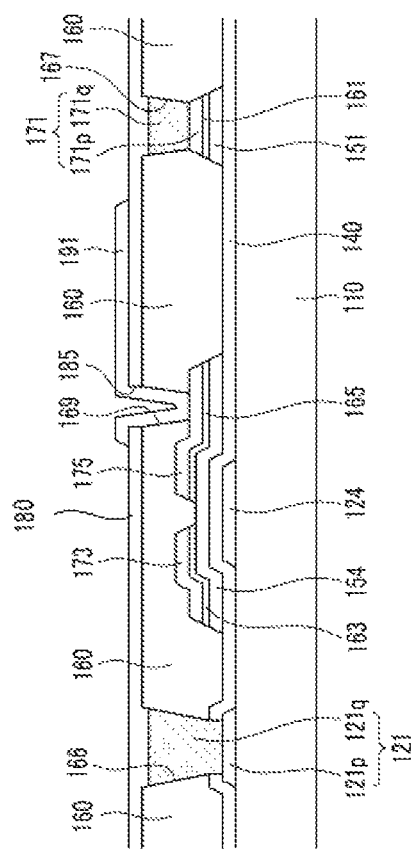
FIG. 18 is a cross-sectional view of the exemplary embodiment of a thin film transistor array panel shown in FIG. 17 taken along line XVIII-XVIII.

FIG. 17 is a top plan layout view of another exemplary embodiment of a TFT array panel according to the present invention, and FIG. 18 is a cross-sectional view of the exemplary embodiment of a TFT array panel shown in FIG. 17 taken along line XVIII-XVIII.

Like descriptions between the exemplary embodiments will be mainly omitted, and like reference numerals will be used for like elements.

A plurality of lower gate lines 121p are formed on an insulation substrate 110. The lower gate line 121p includes a wiring portion mainly extending in the substantially horizontal direction, a gate electrode 124 extending upward from the wiring portion, and an end portion 129p disposed on the end of the wiring portion and having a wide width for connection with an external circuit.

A gate insulating layer 140 is formed on the lower gate line 121p and the insulation substrate 110, and a plurality of semiconductor stripes 151 extending in the substantially vertical direction, exemplary embodiments of which may be made of amorphous or crystallized silicon, are formed on the gate insulating layer 140. The semiconductor stripes 151 include a plurality of protrusions 154 extending toward the gate electrodes 124.

A plurality of ohmic contact stripes 161 and a plurality of ohmic contact islands 165, exemplary embodiments of which may be made of silicide or amorphous silicon doped with n-type impurity at a high concentration, are formed on the semiconductor stripes 151. The ohmic contact stripes 161 include a plurality of protrusions 163 extended toward the protrusions 154. The protrusions 163 and the ohmic contact islands 165 form a pair and are disposed on the protrusions 154 of the semiconductor stripes 151.

A plurality of lower data lines 171p and a plurality of drain electrodes 175 are formed on the ohmic contact stripes 161, the ohmic contact islands 165, and the gate insulating layer 140.

The lower data lines 171p extend in the substantially vertical direction thereby extending substantially perpendicularly to the lower gate lines 121p, and each lower data line 171p includes a plurality of source electrodes 173 extending toward the gate electrodes 124 and an end portion 179p having a wide width for connection with an external circuit.

The drain electrodes 175 are separated from the lower data lines 171p, and are disposed opposite to the source electrode 173 on the protrusions 154 of the semiconductor stripes 151.

A gate electrode 124, a source electrode 173, and a drain electrode 175, along with the protrusion 154 of the semiconductor stripe 151, form a TFT.

In the current exemplary embodiment, the semiconductor stripes 151 have substantially the same plane shape as the lower data lines 171p and the drain electrodes 175 except for in the channel regions between the source electrodes 173 and the drain electrodes 175. In the current exemplary embodiment, the ohmic contact stripes 161 have substantially the same plane shape as the lower data lines 171p, and are disposed between the semiconductor stripes 151 and the lower data lines 171p. Also in the current exemplary embodiment, the ohmic contact islands 165 have substantially the same plane shape as the drain electrodes 175 and are disposed between the semiconductor stripes 151 and the drain electrodes 175. The arrangement described in the current exemplary embodiment enables a simple manufacturing process, however, alternative exemplary embodiments include configurations wherein the semiconductor stripes 151, ohmic contact stripes 161 and ohmic contact islands 165 have different plane shapes as would be known to one of ordinary skill in the art.

An insulating layer 160 is formed on the lower data lines 171p, the drain electrodes 175, and the gate insulating layer 140. In one exemplary embodiment, the insulating layer 160 may have a thickness of about 5000 Å to about 30,000 Å. The insulating layer 160 includes the first trenches 167 extending in the vertical direction and the second trenches 166 extending in the horizontal direction.

The first trenches 167 are extended in substantially the same direction as, and are aligned with, the lower data lines 171p and expose the lower data lines 171p. In the present exemplary embodiment, the first trenches 167 have a narrower width than the lower data lines 171p, and include wide end portions 169 exposing the end portions 179p of the lower data lines 171p.

The second trenches 166 extend in substantially the same direction as, and are aligned with, the wiring portion of the lower gate lines 121p and expose the lower gate lines 121p. In the present exemplary embodiment, the second trenches 166 have a narrower width than the lower gate lines 121p, and include wide end portions 168 exposing the end portions 129p of the lower gate lines 121p. In the current exemplary embodiment, the second trench 166 is omitted on the intersection portion with the first trench 167.

A plurality of upper data lines 171q is formed in the first trenches 167. The upper data lines 171q are filled in the first trenches 167 and include a wide end portion 169 disposed on the end portion 179p of the lower data line 171p. The upper data lines 171q have a narrower width and are thicker than the lower data lines 171p.

A plurality of upper gate lines 121q is formed in the second trenches 166. The upper gate lines 121q are filled in the second trenches 166 and include a wide end portion 168 disposed on the end portion 129p of the lower gate line 121p. The upper gate lines 121q have a narrower width and are thicker than the lower gate lines 121p.

A passivation layer 180 is formed on the upper gate lines 121q, the upper data lines 171q, and the insulating layer 160. The passivation layer 180 has a plurality of contact holes 181 and 182 respectively exposing the upper gate lines 121q and the upper data lines 171q, and the passivation layer 180 and the insulating layer 160 have a plurality of contact holes 185 and 169 exposing the drain electrodes 175.

Contact assistants 81 and 82 are connected to the end portions 129 of the gate lines 121 and the end portions 179 of the data lines 171 through the contact holes 181 and 182, respectively. The contact assistants 81 and 82 function to enhance the adhesiveness between the end portions 129 of the gate lines 121 and the pad portions 179 of the data lines 171 and an external apparatus such as a driver IC, and also to protect them. Exemplary embodiments include configurations wherein the contact assistants 81 and 82 are omitted.

A plurality of pixel electrodes 191 and a plurality of contact assistants 81 and 82 are formed on the passivation layer 180. The pixel electrodes 191 are connected to the drain electrodes 175 through the contact holes 185 and 169, and receive data voltages from the drain electrodes 175.

Unlike the previous exemplary embodiments, in the present exemplary embodiment the gate electrodes 124 extend from the wiring portion of the gate lines 121 such that the TFTs are not disposed on the wiring of the gate lines 121. Accordingly, the upper gate line 121q may be formed on the entire wiring except for the intersection portion with the upper data lines 171q such that the area of the upper gate lines 121q is increased, and as a result it lowers the overall resistance of the gate wiring.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display panel comprising:
a lower gate line;
a lower data line disposed substantially perpendicular to the lower gate line;
a thin film transistor connected to the lower gate line and the lower data line;
an insulating layer disposed on the lower gate line, the lower data line, and the thin film transistor and having a plurality of trenches exposing the lower gate line and the lower data line;
an upper gate line disposed in the trench on the lower gate line;
an upper data line disposed in the trench on the lower data line; and
a pixel electrode connected to the thin film transistor.

2. The display panel of claim 1, wherein:
the upper gate line is thicker than the lower gate line; and
the upper data line is thicker than the lower data line.

3. The display panel of claim 2, wherein the upper gate line and upper data line include one of copper and silver.

4. The display panel of claim 3, wherein the lower gate line and the lower data line include at least one selected from the group consisting of molybdenum, nickel and titanium.

5. The display panel of claim 2, wherein the trenches have a linear shape and are aligned with at least one of the lower gate line and the lower data line.

6. The display panel of claim 5, wherein the trenches are not disposed on the thin film transistor.

7. The display panel of claim 2, wherein the pixel electrode is disposed under the insulating layer.

8. The display panel of claim 2, further comprising:
a passivation layer disposed on the insulating layer,
wherein the passivation layer and the insulating layer have a contact hole exposing a portion of the thin film transistor, and
the pixel electrode is connected to the thin film transistor through the contact hole in the passivation layer.

9. A display panel comprising:
a lower gate line including a gate electrode;
a gate insulating layer disposed on the lower gate line;
a semiconductor disposed on the gate insulating layer;
a lower data line including a source electrode disposed overlapping a portion of the semiconductor;
a drain electrode disposed substantially opposite to the source electrode and overlapping a portion of the semiconductor;
an insulating layer disposed on the lower data line and the drain electrode and including a plurality of trenches exposing the lower gate line and the data line;
an upper gate line disposed in the trench on the lower gate line;
an upper data line disposed in the trench on the lower data line; and
a pixel electrode connected to the drain electrode.

10. The display panel of claim 9, wherein:
the trenches have a linear shape; and
the trenches are not disposed on the gate electrode, the source electrode, and the drain electrode.

* * * * *